United States Patent
De Ceuninck

(10) Patent No.: US 7,671,768 B2
(45) Date of Patent: Mar. 2, 2010

(54) DIGITAL-TO-ANALOGUE CONVERTER SYSTEM WITH INCREASED PERFORMANCE

(75) Inventor: Ward De Ceuninck, Nerem (BE)

(73) Assignees: Interuniversitair Microelektronica Centrum (IMEC), Leuven (BE); Universiteit Hasselt, Diepenbeek (BE)

( * ) Notice: Subject to any disclaimer, the term of this patent is extended or adjusted under 35 U.S.C. 154(b) by 29 days.

(21) Appl. No.: 11/579,016

(22) PCT Filed: May 2, 2005

(86) PCT No.: PCT/BE2005/000064

§ 371 (c)(1), (2), (4) Date: Sep. 9, 2008

(87) PCT Pub. No.: WO2005/107078

PCT Pub. Date: Nov. 10, 2005

(65) Prior Publication Data

US 2009/0002212 A1    Jan. 1, 2009

(30) Foreign Application Priority Data

Apr. 30, 2004    (EP)    ................................. 04447110

(51) Int. Cl.
H03M 1/06    (2006.01)
(52) U.S. Cl. ...................................... 341/118; 341/144
(58) Field of Classification Search ................. 341/118, 341/144, 145
See application file for complete search history.

(56) References Cited

U.S. PATENT DOCUMENTS

| 4,412,208 | A |   | 10/1983 | Akazawa et al. | ............. | 340/347 |
| 4,465,996 | A |   | 8/1984  | Boyacigiller et al. | ........ | 340/347 |
| 4,885,581 | A | * | 12/1989 | Sugawara et al. | ........... | 341/145 |
| 6,946,983 | B2 | * | 9/2005 | Andersson et al. | .......... | 341/118 |

FOREIGN PATENT DOCUMENTS

DE    40 03 682 A1    8/1991
EP    0 280 321 A    8/1988

OTHER PUBLICATIONS

International Search Report for PCT/BE2005/000064 dated Aug. 12, 2005.

* cited by examiner

Primary Examiner—Brian Young
(74) Attorney, Agent, or Firm—McDonnell Boehnen Hulbert & Berghoff LLP

(57) ABSTRACT

The invention relates to an N-bit digital-to-analogue converter (DAC) system, comprising—a DAC unit comprising an N-bit master DAC and a slave DAC, yielding a master DAC unit output signal and a slave DAC unit output signal, respectively, said N-bit master DAC having an output step size,—an adder unit combining the master DAC unit output signal and the slave DAC unit output signal, and—a means for storing correction values for at least the master DAC, said correction values being used by the slave DAC, whereby the DAC system is arranged for master DAC output corrections with a size in absolute value higher than half of the output step size.

15 Claims, 3 Drawing Sheets

DIGITAL-TO-ANALOGUE CONVERTER SYSTEM WITH INCREASED PERFORMANCE

FIELD OF THE INVENTION

The invention relates to digital-to-analogue converters and methods to determine and increase the performance of such devices.

BACKGROUND OF THE INVENTION

Increasingly higher resolution Digital-to-Analogue Converters (DAC) are being developed and implemented in instrumentation and consumer electronics. The number of bits presents an overall indication of the devices' precision, the theoretically achievable resolution however is never reached due to non-linear behaviour specific for each device/production series, set aside aging and other physical influences. Therefore, the transfer function of a digital-to-analogue converter (DAC) is always an approximation of the ideal theoretical curve.

Several parameters are used to describe the quality of a DAC such as resolution, monotonicity, differential & integral linearity. The most severe parameter is the integral linearity. The error function associated with the deviation of the actual values from the ideal transfer curve is called the integral non-linearity. This is nothing else than the difference between the theoretical and measured DAC transfer function over the entire operating range the device can cover. It is common to see that DAC chips with a 20 . . . 24 bit resolution typically have an integral linearity of 16 bit at its best.

In order to improve this, a first step consists in determining the deviation of the ideal behaviour. This can be obtained by measuring all possible DAC output values. However, this would be a time consuming procedure since a 24 bit device has a total of over 16 million input codes! Also, due to the very high resolution of a 24-bit DAC, the voltages need to be measured with extremely high precision (typically using a 8.5 digit multimeter), which implies that a single measurement will take about one second to achieve the required precision.

Patent document DE 4003682 discloses a D/A converting system wherein, during an intermediate matching operation, the output signals are sequentially measured at high velocity. The detected defects are then digitised and stored in a memory. The memory address signal is formed by the coarse positions of each digital signal at the input of D/A converter circuit consisting of a coarse converter and a fine converter. During normal operation, the memory output signal is fed to a third (correction) D/A converter, the weighted output signal of which is added to the output signal of said D/A converter circuit. The corrections have the size of only half a LSB.

The D/A converting system in DE 4003682 needs 3 D/A converters. The proposed solutions make use of a set of low resolution DACs arranged in such a way as to obtain a higher resolution. However, the integral linearity of this configuration cannot be guaranteed, resulting in unwanted distortion. Also restrictions, regarding linearity, are implied with respect to the set of DACs.

A very similar approach can be found in U.S. Pat. No. 4,843,392.

AIM OF THE INVENTION

The present invention describes methods to determine the integral linearity performance of a Digital-to-Analogue Converter (DAC) and DAC systems with increased integral linearity performance up to or near the level of the resolution specification.

SUMMARY OF THE INVENTION

In a first aspect of the invention an N-bit a digital-to-analogue converter (DAC) system is disclosed, comprising
a DAC unit comprising an N-bit master DAC and a slave DAC (said slave DAC being used to correct the non-linearities of said master DAC), yielding a master DAC unit output signal and a slave DAC unit output signal, respectively, the N-bit master DAC having an output step size,
an adder unit combining the master DAC unit output signal and the slave DAC unit output signal, and
a means for storing correction values for at least the master DAC, said correction values being used by the slave DAC, whereby the DAC system is arranged for master DAC output corrections with a size in absolute value higher than half of the output step size. The corrections may alternatively have the size of one output step or even amount to several output step sizes.

In a preferred embodiment the DAC unit consists of an N-bit master DAC and a slave DAC.

Preferably the master DAC output corrections are performed directly by the slave DAC or indirectly, i.e. with some intermediate processing before the slave DAC.

Advantageously the N-bit DAC system also comprises a processing unit, that generates an input signal to the slave DAC.

Preferably the slave DAC has a resolution of N bits or less.

In a particular realisation the master DAC unit and the slave DAC unit output signals are current outputs being summed and the system further includes a current-to-voltage converter (for instance op-amp based) being fed with the summed currents.

In an alternative realisation the master DAC unit output signal and the slave DAC unit output signal are voltage outputs, possibly obtained by a current-to-voltage conversion of the master DAC and slave DAC outputs. The adder unit is then fed with said two voltage signals.

In a preferred implementation the slave DAC behaviour is optimised. The slave DAC unit output signal then is applied to a voltage divider. In that way the slave DAC can be used over its entire voltage range, thereby reducing non-linearity errors of the slave DAC.

In an advantageous embodiment the means for storing correction values is arranged for storing less than $2^N$ correction values.

In another embodiment the N-bit DAC system is mounted on a PCB board. Alternatively monolithic integration can be used.

In a specific embodiment the storage means is an EPROM, placed on the PCB board or integrated also monolithically.

In another object the invention relates to a (fast) method for determining the correction values of an N-bit DAC system as previously described. The method comprises the steps of:
determining the performance of said N-bit master DAC, and
calculating based on said determined performance said correction values, whereby the step of performance determining is carried out via either DC measurements or AC measurements.

In an embodiment with DC measurements, DC voltage measurements are performed for a selected subset of all possible input codes, said subset being selected such that any other input code can be constructed with the selected input codes. The step of calculating correction values then comprises calculating correction codes for input codes not belonging to the selected subset. The calculation of the correction codes is typically performed in the processor unit.

In an embodiment with AC measurements a plurality of sine waves is applied to the master DAC, distortion spectra are determined from the DAC system's output signal and correction values are calculated from the distortion spectra.

SHORT DESCRIPTION OF THE DRAWINGS

DETAILED DESCRIPTION OF THE INVENTION

Figure 1:
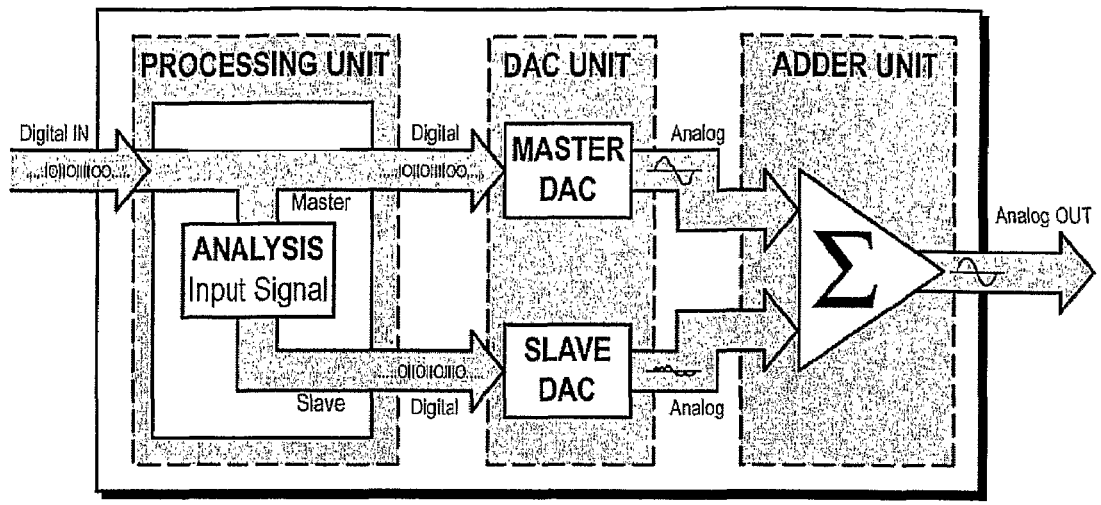
FIG. 1 represents the configuration of the principle according to the present invention.

The solution according to the present invention basically aims to minimise the deviations from the ideal DAC transfer function by combining (adding) the output of the (master) DAC and the output from a second DAC, called slave DAC, that tries to compensate for the errors of the master DAC. The sum of the master DAC output and the slave DAC outputs results in greatly enhanced distortion figures (much better non-linearity specs) (FIG. 6) that are normally not achievable with standard techniques.

Therefore the (master) DAC under study needs to be characterised. It is sufficient to determine the deviation for each single bit word (e.g. 001, 010, 100 for a 3 bit DAC). All other possible combinations can easily be calculated. There are many possibilities to perform such a characterisation. A few examples will be briefly treated in the next paragraph, but there are many different ways to achieve the same result.

The non-linearities are characterised by a set of DC measurements or, alternatively, by a set of AC measurements. The DC characterisation measurements are performed using highly accurate DC voltage measurements. A series of random transitions is programmed and the actual difference in output signal is calculated (see also FIG. 5). Transitions are measured instead of static values in order to get rid of parasitic drift related error signals (e.g. temperature changes, joule heating effects, aging, . . . ) that are superimposed on the actual static voltage level. This is performed for many transitions, in such way, that all bits have been addressed. The output of such an experiment is a graph of the non-linearity error of each single bit word (expressed in least square bit units, LSB) as a function of the addressed bits. Using the obtained information, the correction code for each unique digital code can be calculated and the slave DAC can use this information to counteract the errors of the master DAC. Alternatively, AC characterisation measurements can be used for the characterisation. They are performed in the following way: a plurality of sine waves is generated digitally using a word clock generator. For each sine wave the output of the DAC system is sent to a low noise spectrum analyser and the distortion spectrum measured is used to determine the non-linear behaviour of the (master). DAC.

At this stage, the non-linearity of the (master) DAC is fully characterised. It is now possible to establish the integral non-linearity function by making the difference between the measured/calculated transfer function and the theoretical response function. This can be corrected by means of a second DAC (slave DAC), which is used in order to correct the above-mentioned non-linearities.

The digital-to-analogue converter system according to the invention comprises three important units: the processing unit, the DAC stage & the adder unit.

Digital data are entered at the input side of the processing unit. The processing unit determines the digital data that will be sent to the slave DAC to correct for non-linearities of the master DAC transfer function. The correction values for each individual code are calculated based on a set of correction data that are stored in a non-volatile memory unit. The digital master output channel of the processing unit remains unchanged (straight mode).

In the DAC stage, the master & slave DAC transform their digital input to analogue output values. In the third block, the analogue outputs are added together.

Figure 2:
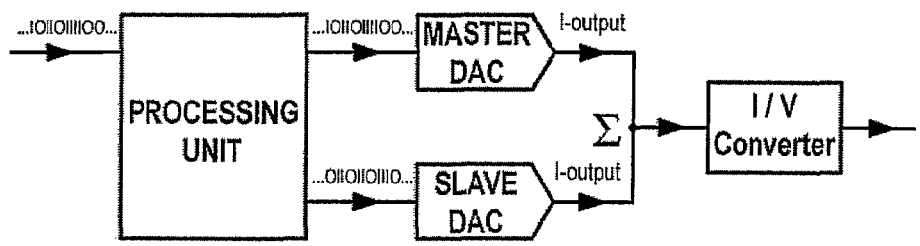
FIG. 2 represents the current level addition.

There are many ways to implement the addition of the analogue signals, a few of which are now described. A current level addition is applicable if the DAC has a current output, which for most DACs is the case. The outputs of the master DAC & slave DAC can be configured in parallel and the currents are summed as such, as shown in FIG. 2. In a next step, the combined output is injected in an opamp based current-to-voltage converter stage, where it is transformed into a voltage output.

Figure 3:
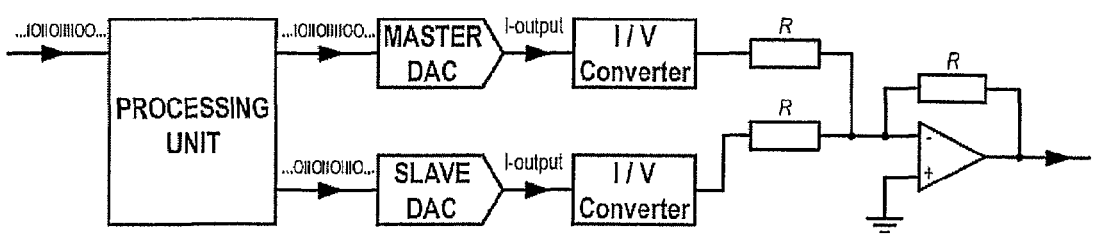
FIG. 3 represents the voltage level addition.

A voltage level addition can be used if the DACs have a voltage output, but is also applicable for current output DACs. In the latter case I/V converters are then provided. The voltages are added using an adder circuit as shown in FIG. 3.

Figure 4:
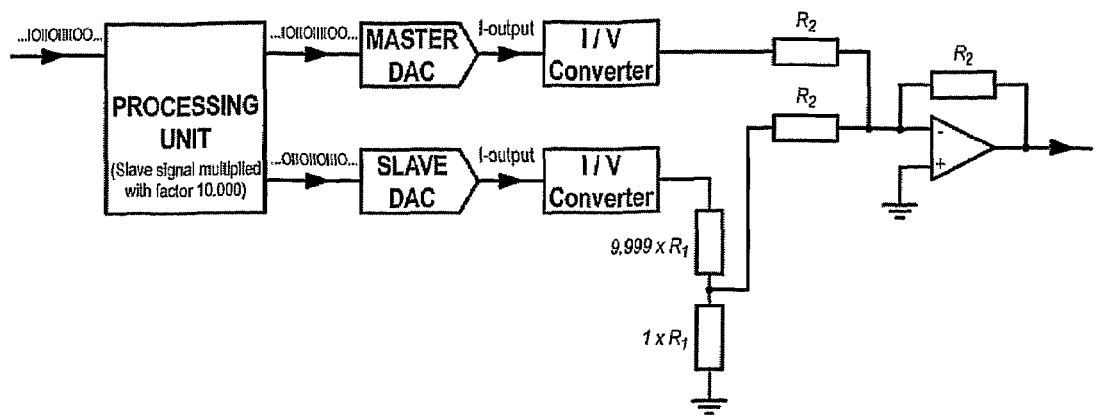
FIG. 4 represents the alternative Voltage level addition.

In an alternative voltage level addition scheme the configuration (see FIG. 4) is similar to the normal voltage level adder, but has some extra features to optimise the behaviour of the slave DAC.

Figure 5:
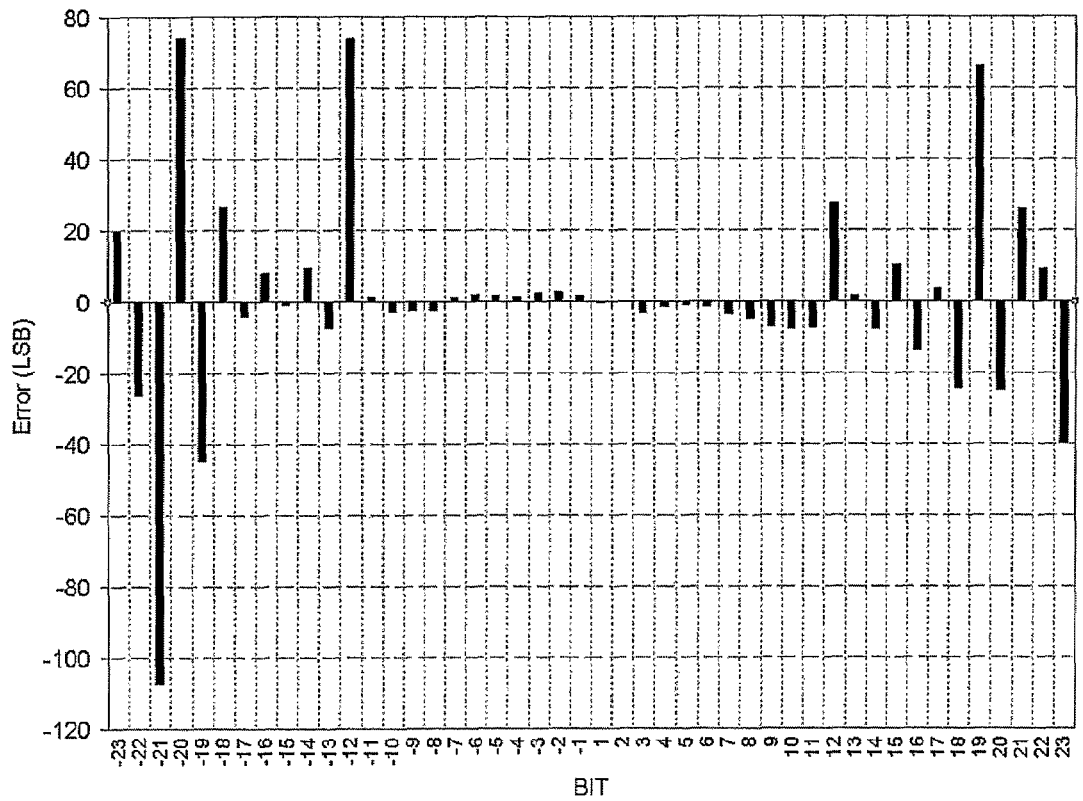
FIG. 5 represents the non-linearity of a typical 24 bit high-end audio DAC.

For reasons of simplicity, the slave DAC and master DAC are identical in design. This is however not a requirement, but it is convenient, because of simplicity. When looking at the non-linearity graph (see FIG. 5), it can be seen that the largest errors are to be expected at larger bit values. FIG. 5 shows the measured errors on the single bit word output of a typical high-end 24 bit audio DAC running at 1 MHz. At higher bit values, errors of 100 LSB are possible, while at the lowest bits errors of a few LSB are more common. However, the slave DAC suffers from the same non-linearities. The correction of a 100 LSB error is quite successful if it can be executed with a precision of a few LSB. However, for low level output signals, where the errors are only a few LSB, this is not sufficient at all: the error on the slave DAC is comparable to the errors that are expected in the master DAC. To solve this problem, the alternative voltage addition can be used. The idea behind this technique is simple: try to use the slave DAC over its entire voltage range to cover the amount of correction needed. As an example the method is applied to a commercial 24 bit DAC. The largest errors of single bit words amount up to 100 LSB. This means a correction range of 800 LSB would be largely sufficient for an arbitrary code. This code is now (digitally) multiplied with a given factor, so that the full range of the slave DAC is used. In this particular case, a factor of 10000× would be possible. After conversion to voltage, the analogue signal of the slave DAC is divided by the same factor (10000×) and added to the analogue signal of the master DAC. By doing so, the errors of the slave DAC are strongly reduced. In this particular case, the expected 100LSB errors are divided by a factor 10000 which results in a precision of 0.01 LSB which is far superior to the few LSB of the unaltered slave DAC operating in a narrow range. By doing so, the distortion levels at small signal values can strongly be improved.

Figure 6:
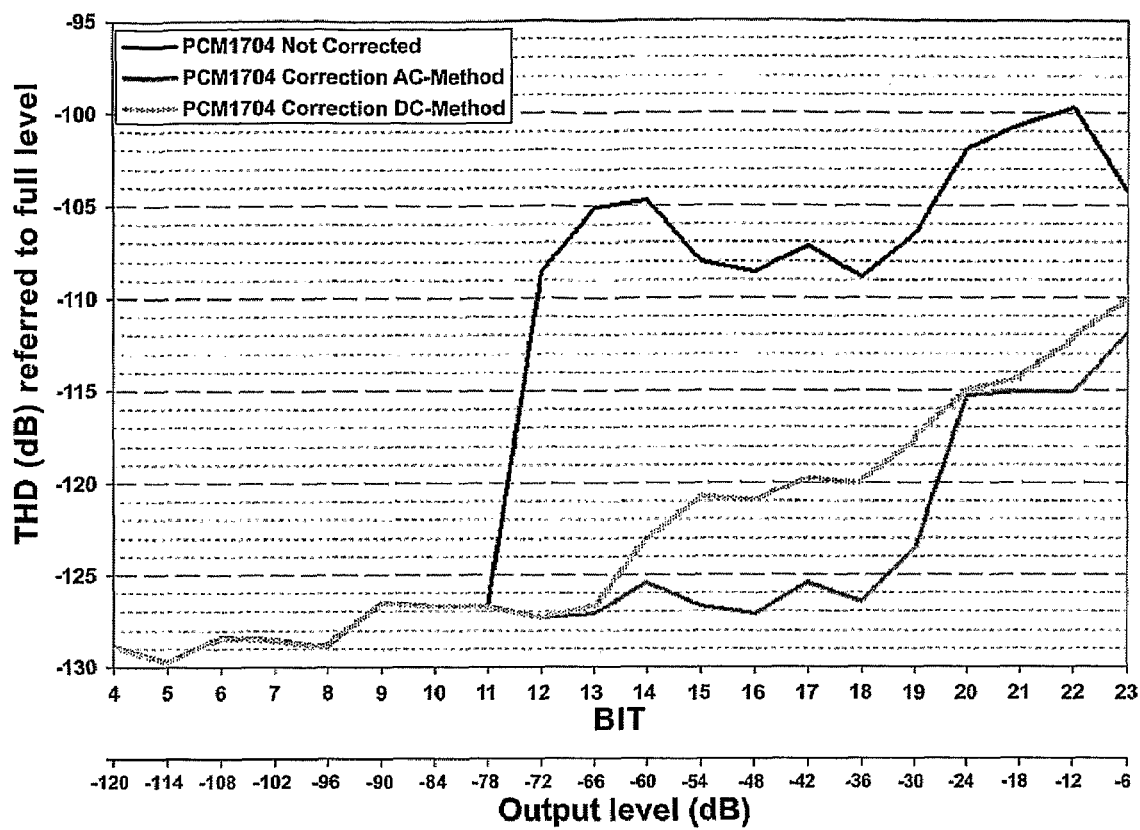
FIG. 6 represents the distortion levels for the DAC system of the invention and for a straight DAC configuration.

To demonstrate the benefits of the approach according to the present invention a commercially available PCM1704 24 bit high-end audio DAC was used. In FIG. 6 is shown the total harmonic distortion as a function of the output level. The black curve corresponds to the straight operation of the commercial product.

Practical Implementation

The solution can be implemented at two levels: using a PCB board or using monolitic integration. After assembly, the master DAC and optionally, the correction DAC are characterised in a burn-in test system and the calculated correction data are stored in an on-board EPROM.

There are also possibilities to take into account the influence of temperature and ageing effects if very large fluctuations are to be expected. In that case, the DAC modules are tested under different environmental conditions and the needed correction data can be determined for the different operating conditions. These data can be stored in an on board EPROM. Appropriate correction can be performed by measuring the operating condition of the chip.

The invention claimed is:

1. A N-bit digital-to-analogue converter (DAC) system, comprising
   a DAC unit comprising an N-bit master DAC and a slave DAC, yielding a master DAC unit output signal and a slave DAC unit output signal, respectively, said N-bit master DAC having an output step size,
   an adder unit combining said master DAC unit output signal and said slave DAC unit output signal, and
   a means for storing correction values for at least said master DAC, said correction values being used by said slave DAC,
   whereby said DAC system is arranged for master DAC output corrections with a size in absolute value higher than half of said output step size.

2. A N-bit digital-to-analogue converter (DAC) system as in claim 1, wherein said master DAC output corrections are performed directly or indirectly.

3. A N-bit DAC system as in claim 1, further comprising a processing unit, said processing unit generating an input signal to said slave DAC.

4. A N-bit DAC system as in claim 1, wherein said slave DAC has a resolution of N bits or less.

5. A N-bit DAC system as in claim 1, wherein said master DAC unit output signal and said slave DAC unit output signal are current outputs.

6. A N-bit DAC system as in claim 1, wherein said master DAC unit output signal and said slave DAC unit output signal are voltage outputs.

7. A N-bit DAC system as in claim 6, further comprising current-to-voltage converters for obtaining said voltage outputs.

8. A N-bit DAC system as in claim 7, wherein said slave DAC unit output signal is applied to a voltage divider.

9. A N-bit DAC system as in claim 1, whereby said means for storing correction values is arranged for storing less than $2^N$ correction values.

10. A N-bit DAC system as in claim 1, mounted on a Printed Circuit Board.

11. A N-bit DAC system as in claim 1, said DAC system being integrated monolithically.

12. A N-bit DAC system as in claim 1, wherein said means for storing is an EPROM, placed on a printed circuit board or integrated monolithically.

13. A method for determining said correction values of an N-bit DAC system as in claim 1, comprising the steps of:
   determining the performance of said N-bit master DAC, and
   calculating based on said determined performance said correction values, characterised in that said step of performance determining is carried out via either DC measurements or AC measurements.

14. A method for determining said correction values as in claim 13, wherein said DC measurements comprise performing DC voltage measurements for a selected subset of all possible input codes, said subset being selected such that any other input code can be constructed with said selected input codes, and wherein said step of calculating correction values comprises calculating correction codes for input codes, not belonging to said selected subset.

15. A method for determining said correction values as in claim 13, wherein said AC measurements are carried out by applying a plurality of sine waves to said master DAC, determining distortion spectra from said DAC system's output signal, and calculating said correction values from said distortion spectra.

* * * * *